(12) United States Patent
Yamazaki

(10) Patent No.: US 8,638,894 B2
(45) Date of Patent: Jan. 28, 2014

(54) DATA COMMUNICATION APPARATUS, DATA COMMUNICATION SYSTEM, AND DATA COMMUNICATION METHOD

(75) Inventor: Yoshikazu Yamazaki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 972 days.

(21) Appl. No.: 12/524,479

(22) PCT Filed: Feb. 19, 2008

(86) PCT No.: PCT/JP2008/053123
§ 371 (c)(1),
(2), (4) Date: Jul. 24, 2009

(87) PCT Pub. No.: WO2008/105350
PCT Pub. Date: Sep. 4, 2008

(65) Prior Publication Data
US 2009/0323785 A1 Dec. 31, 2009

(30) Foreign Application Priority Data

Feb. 27, 2007 (JP) ................................ 2007-047551
Oct. 26, 2007 (JP) ................................ 2007-279354

(51) Int. Cl.
*H04L 7/02* (2006.01)
(52) U.S. Cl.
USPC ........... 375/360; 375/359; 375/355; 375/316; 375/219; 375/295; 375/220; 375/223; 375/271
(58) Field of Classification Search
USPC ......... 375/360, 359, 354, 355, 316, 219, 295, 375/220, 223, 271
See application file for complete search history.

(56) References Cited

U.S. PATENT DOCUMENTS

2003/0231727 A1* 12/2003 Ito .................................. 375/364
2004/0133820 A1* 7/2004 Tanabe et al. ................. 713/600
(Continued)

FOREIGN PATENT DOCUMENTS

JP 2005-012669 1/2005
JP 2005-012669 A 1/2005
(Continued)

OTHER PUBLICATIONS

State Intellectual Property Office of the People's Republic of China, Office Action dated Feb. 17, 2012, in connection with Application No. 200880005986.4 (5 pages).
(Continued)

*Primary Examiner* — Zewdu Kassa
(74) *Attorney, Agent, or Firm* — Fitzpatrick, Cella, Harper & Scinto

(57) ABSTRACT

An object of the present invention is to provide a data communication technique which can reduce a size of a system by enabling bidirectional data communication, and enables a cheap system configuration. A data communication apparatus is provided, the data communication apparatus including a signal terminal (IN) for inputting receiving signals of pulses of which rise times or fall times are mutually different, a reference voltage terminal (GND) for inputting a reference voltage, a rise detection circuit (11) for detecting a rise or a rise time of the receiving signal, a fall detection circuit (12) for detecting a fall or a fall time of the receiving signal, a data signal conversion circuit (13) for generating a clock signal or a data signal based on a result of a detection by the rise detection circuit or the fall detection circuit, and an internal circuit (14) for inputting the clock signal or the data signal generated by the data signal conversion circuit, and for outputting a transmission signal to the signal terminal.

6 Claims, 4 Drawing Sheets

(56) References Cited

U.S. PATENT DOCUMENTS

2006/0098691 A1* 5/2006 Yamazaki ............... 370/518
2007/0288780 A1  12/2007 Yamazaki ............... 713/322

FOREIGN PATENT DOCUMENTS

| JP | 2005-012669 A | 1/2005 |
| JP | 2006-135888 | 5/2006 |
| JP | 2006-135888 A | 5/2006 |
| JP | 2007-288612 | 11/2007 |

OTHER PUBLICATIONS

Korean Intellectual Property Office, Office Action dated Feb. 25, 2011, Dispatch No. 9-5-2011-011291327, 4 pages (and English translation thereof).

* cited by examiner

DATA COMMUNICATION APPARATUS, DATA COMMUNICATION SYSTEM, AND DATA COMMUNICATION METHOD

TECHNICAL FIELD

The present invention relates to data communication, particularly, to data communication between data communication apparatuses.

BACKGROUND ART

Japanese Patent Application Laid-Open No. 2006-135888 describes, for example, such a configuration that bidirectional data communication is enabled between two contact points to reduce the size of a system in which a data carrier device and a data carrier driving device execute bidirectional data communication.

In a data communication system described in the above Japanese Patent Application Laid-Open No. 2006-135888, the data carrier device includes a signal terminal for inputting a signal from the data carrier driving device and a reference voltage terminal for inputting a reference voltage. The signal input from the data carrier driving device to the signal terminal of the data carrier device includes a part whose duty ratio is different, and is a pulse signal whose pulse frequency is constant as a whole. The data carrier device includes a data communication circuit generating a clock signal and a data signal based on the input pulse signal, and executes all operations by using the input pulse signal as a source voltage. The data carrier device includes a switch circuit controlling whether or not to supply a constant current to output the data signal to the data carrier driving device through the signal terminal. The data carrier driving device includes a current detection circuit generating the data signal according to the current flowing to the signal terminal of the data carrier device.

The data carrier device generates the clock signal and the data signal to communicate data based on the pulse signal, which is input from the data carrier driving device, and includes a part whose duty ratio is different, and whose pulse frequency is constant as a whole. The data carrier driving device generates the data signal with the current detection circuit to communicate data, the current detection circuit detecting the current flowing to the signal terminal of the data carrier device, the current being controlled by the switch circuit for controlling whether or not to supply the constant current as the data signal of the data carrier device. Thereby, the bidirectional data communication can be executed between two contact points.

However, the above bidirectional data communication system includes the following problem. The data carrier device needs to execute all operations by using the pulse signal as a source voltage, the pulse signal being input from the data carrier driving device between two terminals of the signal terminal and the reference voltage terminal. The pulse signal from the data carrier driving device includes a part whose duty ratio is different. Thus, the effective means for steadily operating the data carrier device is to provide a constant voltage circuit in the data carrier device, the constant voltage circuit generating a constant voltage which becomes a source power for an internal circuit. At this time, it is necessary to cause any part of the pulse signal from the data carrier driving device not to be lower than a voltage generated by the constant voltage circuit. Thus, it is necessary to cause a voltage of a low voltage side of the pulse signal from the data carrier driving device to be higher than the voltage generated by the constant voltage circuit in the data carrier device.

Here, such a case will be considered that a voltage value detection circuit is, for example, provided to detect the pulse signal input from the data carrier driving device, the voltage value detection circuit detecting an absolute value of the input pulse signal voltage. In this case, it is necessary to consider the accuracy of the voltage value detection circuit, the accuracy of the constant voltage circuit in the data carrier device, the accuracy of an amplitude value of the input pulse signal voltage, and a voltage noise between the data carrier driving device and the data carrier device. Under such a consideration, it is desired to cause a voltage of a high voltage side of the pulse signal input from the data carrier driving device to be high enough.

However, when the data carrier device is produced in a semiconductor process, if the pulse signal voltage input from the data carrier driving device is higher, the withstand voltage required for the data carrier device becomes higher. Thus, the following is a problem: a component included in the data carrier device becomes larger, and the cost is increased due to the increase of a chip area.

The input signal from the data carrier driving device to the signal terminal of the data carrier device includes a part whose duty ratio is different, and is a pulse signal whose pulse frequency is constant as a whole. In this method, it is necessary to severely control the duty ratio of the input pulse signal, and to cause the data carrier driving device to be an expensive system configured with a microcomputer, and the like, so that this is also a problem to increase a cost of a total system.

DISCLOSURE OF THE INVENTION

An object of the present invention is to provide a data communication technology which can reduce the size of a system by enabling bidirectional data communication in two contact points, and enables a cheap system configuration in the system in which two data communication apparatuses communicate data.

A data communication apparatus of the present invention is characterized by including a signal terminal for inputting receiving signals of pulses of which rise times or fall times are mutually deferent, a reference voltage terminal for inputting a reference voltage, a rise detection circuit for detecting a rise or a rise time of the receiving signal, a fall detection circuit for detecting a fall or a fall time of the receiving signal, a data signal conversion circuit for generating a clock signal and a data signal based on a result of a detection by the rise detection circuit and the fall detection circuit, and an internal circuit for inputting the clock signal and the data signal generated by the data signal conversion circuit, and for outputting a transmission signal to the signal terminal, and characterized in that the data signal conversion circuit generates the data signal based on the rise time or the fall time detected by the rise detection circuit or the fall detection circuit.

A data communication apparatus of the present invention is characterized by including a signal terminal, a transmission signal outputting circuit for outputting to the signal terminal transmission signals of pulses of which rise times or fall times are mutually different, based on a transmission data, and a current detection circuit for generating a receiving data based on the current flowing to the signal terminal.

A data communication system of the present invention is characterized in that a first data communication apparatus and a second data communication apparatus are connected through at least a signal terminal, the first data communication apparatus includes a transmission signal outputting circuit for outputting transmission signals of pulses of which rise times or fall times are mutually different, through the signal terminal to the second data communication apparatus based on a transmission data, and a current detection circuit for generating a receiving data based on the current flowing to the signal terminal, and the second data communication apparatus includes a reference voltage terminal for inputting a reference voltage, a rise detection circuit for detecting a rise or a rise time of the receiving signal received through the signal terminal from the first data communication apparatus; a fall detection circuit for detecting a fall or a fall time of the receiving signal, a data signal conversion circuit for generating a clock signal or a data signal based on a result of a detection by the rise detection circuit or the fall detection circuit; and an internal circuit for inputting the clock signal or the data signal generated by the data signal conversion circuit, and for outputting a transmission signal to the signal terminal, and the data signal conversion circuit generates the data signal based on the rise time or the fall time detected by the rise detection circuit or the fall detection circuit.

A data communication method of the present invention is characterized by including a receiving signal inputting step of inputting receiving signals of pulses of which rise times or fall times are mutually different, at a signal terminal, a reference voltage inputting step for inputting a reference voltage at a reference voltage terminal, a rise detection step for detecting a rise or a rise time of the receiving signal, a fall detection step for detecting a fall or a fall time of the receiving signal, a signal generation step for generating a clock signal or a data signal based on a result of a detection at the rise detection step or the fall detection step; and a transmission signal outputting step for outputting a transmission signal to the signal terminal based on the clock signal or the data signal, and during the signal generation step, the data signal is generated based on the rise time or the fall time detected in the rise detection step or the fall detection step.

A data communication method is characterized by including a transmission signal outputting step for outputting transmission signals of pulses of which rise times or fall times are mutually different, to the signal terminal based on a transmission data, and a data generation step for generating a receiving data based on the current flowing to the signal terminal.

The size of a system can be reduced, because the system can communicate data as connecting with two terminals. A voltage amplitude inputting to the data communication apparatus can be reduced, so that the cost can be reduced by lowering the withstand voltage of a component. In addition, since it is not necessary to accurately maintain a cycle for transmitting and receiving data to be constant, the cost of the data communication system can be reduced.

BEST MODE FOR CARRYING OUT THE INVENTION

Figure 1:
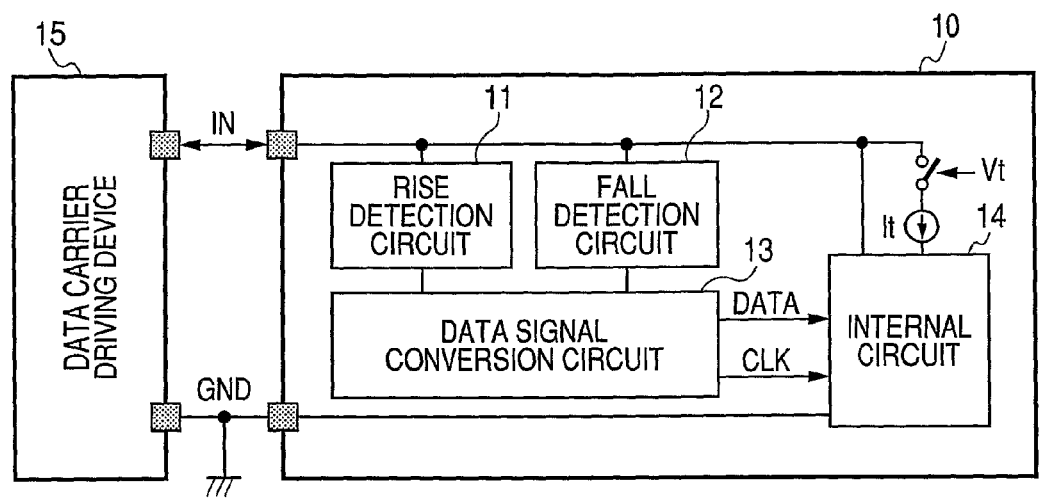
FIG. 1 is a diagram illustrating a configuration example of a data carrier device and a driving device thereof according to an exemplary embodiment of the present invention.

Next, exemplary embodiments for implementing the present invention will be described in detail as referring to the drawings.

FIG. 1 is a block diagram illustrating a data communication system including a data carrier device 10 and a data carrier driving device 15 thereof according to an exemplary embodiment of the present invention. In FIG. 1, Reference numeral 10 denotes a data carrier device (a second data communication apparatus) for communicating data at two contact points with the data carrier driving device 15, and includes two terminals of a terminal IN (signal terminal) and a terminal GND (reference voltage terminal). Reference numeral 15 denotes a data carrier driving device (a first data communication apparatus) as a control device. The data carrier driving device 15 and the data carrier device 10 are connected only at two contact points of the terminal IN and the terminal GND to communicate data through such two contact points. The data carrier device 10 generates a source voltage for all circuits included in the data carrier device 10 from signals input from the data carrier driving device 15 to the terminal IN and the terminal GND of the data carrier device 10. The data carrier device 10 is configured with a rise detection circuit 11, a fall detection circuit 12, a data signal conversion circuit 13, and an internal circuit 14. The rise detection circuit 11 detects a rise of a signal input from the terminal IN. The fall detection circuit 12 detects a fall of a signal input from the terminal IN. The data signal conversion circuit 13 generates a clock signal CLK and a data signal DATA necessary for communicating data based on signals from the rise detection circuit 11 and the fall detection circuit 12. The internal circuit 14 receives the clock signal CLK and the data signal DATA from the data signal conversion circuit 13, and communicates data with the data carrier driving device 15 based on such signals. The internal circuit 14 includes a unit for pulling or pushing a constant current It. The constant current It is ON/OFF-controlled by a switch circuit for a control signal Vt, and the existence of the constant current It is designated as a transmission signal transmitted from the data carrier device 10. The switch circuit is connected to the terminal IN, and controls whether or not to supply the constant current It for outputting the transmission signal to the terminal IN based on the control signal Vt. Meanwhile, the switch circuit is actually a part of the internal circuit 14.

The data carrier driving device 15 includes a transmission signal outputting circuit and a current detection circuit. The transmission signal outputting circuit outputs transmission signals including pulses, whose rise times or fall times are mutually different, to the terminal IN of the data carrier device 10 based on a transmission data. The current detection circuit generates a receiving data based on the current flowing to the terminal IN.

Next, a data communication method of the data communication system of FIG. 1 will be described by using a timing chart of FIG. 2. A pulse voltage is input from the transmission signal outputting circuit of the data carrier driving device 15 to the terminal IN of the data carrier device 10, and in the pulse voltage, a high level of a voltage amplitude is V1, and a low level is V2, and a rise time from the low level V2 to the high level V1 is a constant value. The pulse voltage includes two different fall times of a fall time f1 from the high level V1 to the low level V2, and a fall time f2 which is enough longer than the time f1. The terminal GND is connected to a ground voltage as a reference voltage. In this case, the low level V2 of the pulse voltage is assumed to be higher enough than the ground (GRD) voltage.

The rise detection circuit 11 of FIG. 1 detects that a pulse input at the terminal IN of the data carrier device 10 rises from the low level V2 to the high level V1. For example, the rise detection circuit 11 outputs an output signal Vr which switches from a low level to a high level as synchronized with a rise of the pulse input at the terminal IN from the low level V2 to the high level V1, and after that, switches to the low level again.

The fall detection circuit 12 of FIG. 1 detects that the pulse input at the terminal IN of the data carrier device 10 falls from the high level V1 to the low level V2. For example, the fall detection circuit 12 outputs an output signal Vf which switches from a low level to a high level as synchronized with a fall of the pulse input at the terminal IN from the high level V1 to the low level V2, and after that, switches to the low level again.

Figure 3:
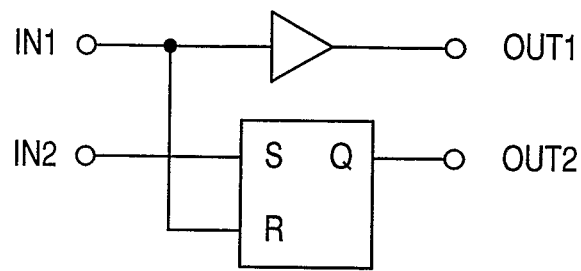
FIG. 3 is a diagram illustrating a circuit configuration example of a data signal conversion circuit of the data carrier device according to the exemplary embodiment of the present invention.

The data signal conversion circuit 13 of FIG. 1 receives the output signal Vr of the rise detection circuit 11 and the output signal Vf of the fall detection circuit 12, and generates the clock signal CLK and the data signal DATA necessary for communicating data. FIG. 3 is a diagram illustrating an example of the data signal conversion circuit 13 in the data carrier device 10 according to the present exemplary embodiment. The present circuit example is a specific example of the data signal conversion circuit 13. The data signal conversion circuit 13 includes two input terminals of an IN1 and an IN2, and two output terminals of an OUTPUT 1 and an OUTPUT 2. The terminal IN1 is connected to an input of a buffer circuit and a terminal R of an SR flip-flop circuit. The terminal IN2 is connected to a terminal S of the SR flip-flop circuit. The terminal OUTPUT 1 is connected to an output of the buffer circuit. The terminal OUTPUT 2 is connected to an output terminal Q of the SR flip-flop circuit. Here, the circuit may be configured so that the buffer circuit may not be included, and the signal input at the terminal IN1 is directly output to the terminal OUTPUT 1.

Figure 2:
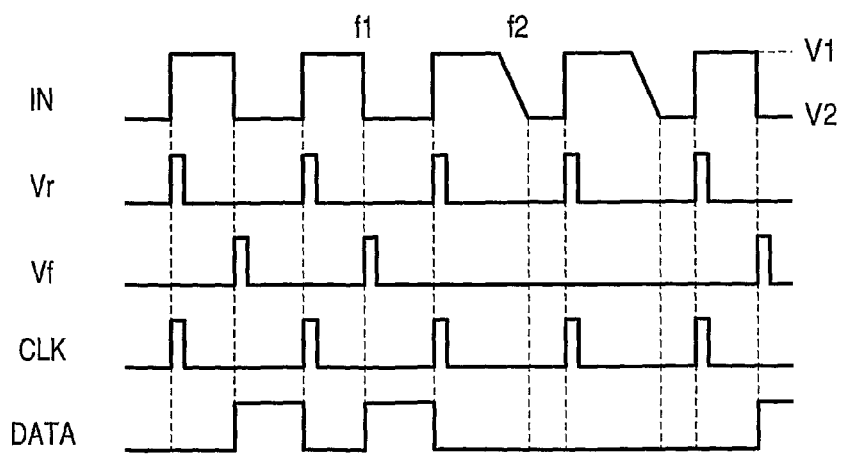
FIG. 2 is a timing chart illustrating an example of operations of the configuration illustrated in FIG. 1.

As illustrated in FIG. 2, by inputting the output signal Vr of the rise detection circuit 11 at the terminal IN1 of the data signal conversion circuit 13 of FIG. 3, the clock signal CLK is generated as the same signal as the output signal Vr of the rise detection circuit 11, and is output to the terminal OUTPUT 1. By inputting the output signal Vf of the fall detection circuit 12 at the terminal IN2, the data signal DATA switches from the low level to the high level as synchronized with a rise of the output signal Vf of the fall detection circuit 12. Thus, the data signal DATA is generated as a signal switching from the high level to the low level as synchronized with a rise of the output signal Vr of the rise detection circuit 11, and is output from the terminal OUTPUT 2.

When a pulse of the terminal IN includes the short fall time f1, a pulse of the output signal Vf is induced, and a rise edge of the data signal DATA is formed. On the other hand, when the pulse of the terminal IN includes the long fall time f2, the pulse of the output signal Vf is not induced, and the rise edge of the data signal DATA is not formed.

As illustrated in FIG. 2, the data signal DATA is switched based on a rise and a fall of the pulse signal input to the data carrier device 10, and the clock signal CLK is obtained, the clock signal CLK being synchronized with a frequency of the pulse signal input at the data carrier device 10. Here, while a duty ratio of the clock signal CLK is not 50%, if a rise edge or a fall edge of the clock signal CLK is used, it is not necessary that the duty ratio is necessarily 50%. If the edge is used, it is possible to synchronize with a timing of the data carrier driving device 15 for transferring the pulse signal, and it becomes easy to design the timing between the data carrier driving device 15 and the data carrier device 10.

The internal circuit 14 inputs the generated clock signal CLK data signal DATA to communicate data. Specifically, when transferring the data signal, the data carrier device 10 ON/OFF-controls the constant current It with the control signal Vt. The data carrier driving device 15 detects the data signal transmitted from the data carrier device 10 by detecting the existence of the constant current It with the current detection circuit in the data carrier driving device 15. Thereby, bidirectional communication is executed between the data carrier device 10 and the data carrier driving device 15.

Since the data carrier device 10 detects a rise and a fall of the input pulse signal, it is not necessary to provide a voltage value detection circuit for detecting an absolute value of a pulse signal voltage input at a data carrier device, the detection being executed in a conventional bidirectional data communication system. Thus, the data carrier device 10 does not need to increase a voltage of a high voltage side of the pulse signal input at the data carrier device 10 in consideration of the accuracy of the voltage value detection circuit. When it is considered from the semiconductor production process, it becomes unnecessary to increase a withstand voltage required for the data carrier device 10, so that a component included in the data carrier device 10 becomes smaller, and the cost can be suppressed because of the reduction of a chip area.

It is not necessary to severely control a duty ratio of the pulse signal input at the data carrier device 10, and to cause the data carrier driving device 15 to be an expensive system configured with a microcomputer, and the like, so that the cost of a total system can be suppressed.

Figure 4:
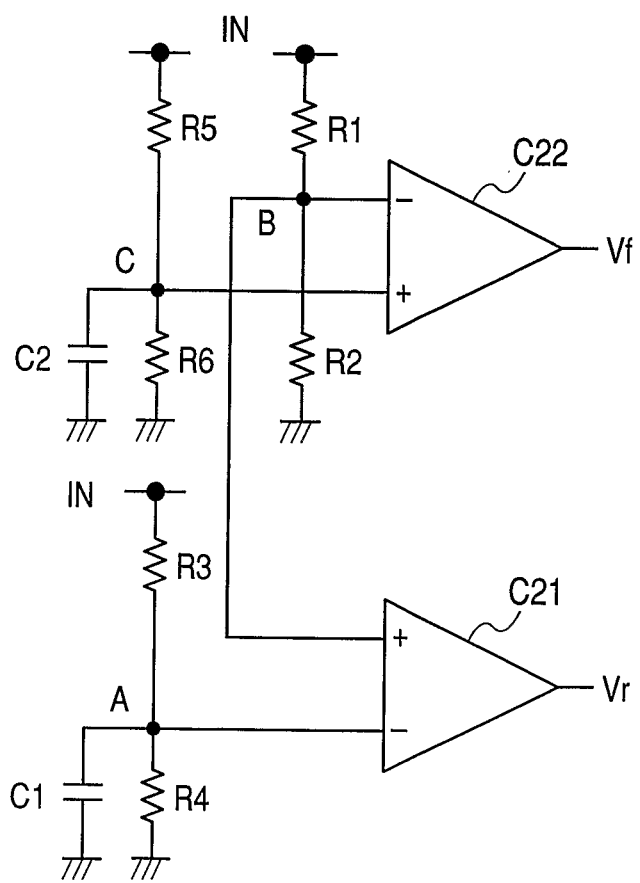
FIG. 4 is a diagram illustrating a circuit configuration example of a rise detection circuit and a fall detection circuit of the data carrier device according to the exemplary embodiment of the present invention.

FIG. 4 is a diagram illustrating a circuit example of the rise detection circuit 11 and the fall detection circuit 12 in the data carrier device 10 according to the present exemplary embodiment. The present circuit example specifically illustrates the rise detection circuit 11 and the fall detection circuit 12.

First, a configuration of the rise detection circuit 11 will be described. A resister R1 and a resister R2 are connected to a positive side input terminal of a comparator C21, other side of the resister R1 is connected to the terminal IN, and other side of the resister R2 is connected to the terminal GND. A resister R3, a resister R4, and a capacitor C1 are connected to a negative side input terminal of the comparator C21, other side of the resister R3 is connected to the terminal IN, and other sides of the resister R4 and the capacitor C1 are connected to the terminal GND.

Next, a configuration of the fall detection circuit 12 will be described. The resister R1 and the resister R2 are connected to a negative side input terminal of a comparator C22, other side of the resister R1 is connected to the terminal IN, and other side of the resister R2 is connected to the terminal GND. A resister R5, a resister R6, and a capacitor C2 are connected to a positive side input terminal of the comparator C22, other side of the resister R5 is connected to the terminal IN, and other sides of the resister R6 and the capacitor C2 are connected to the terminal GND.

Figure 5:
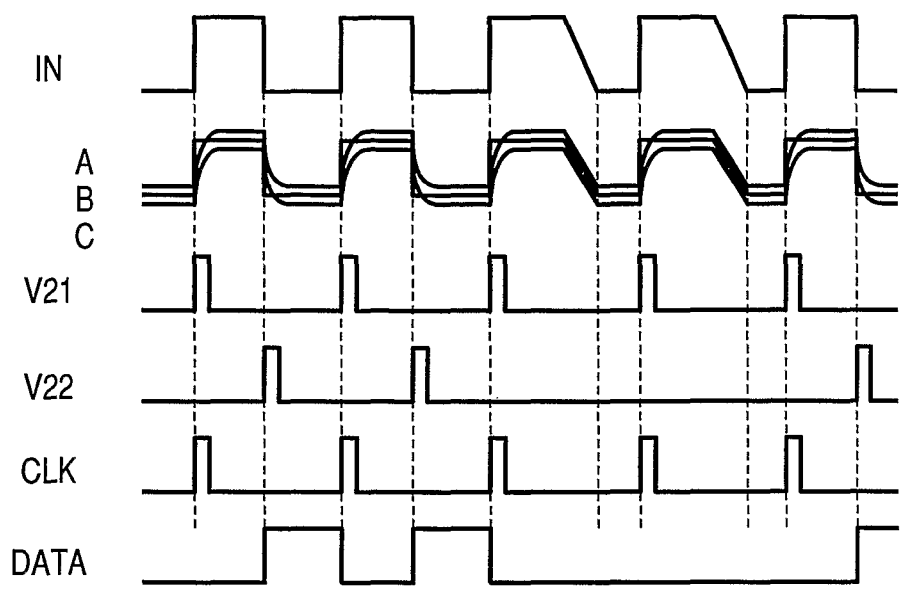
FIG. 5 is a timing chart illustrating an operation of the configuration illustrated in FIG. 4.

Next, an operation of FIG. 4 will be described by using a timing chart of FIG. 5. Here, it is assumed that the negative side input terminal of the comparator C21 is A, the positive side input terminal of the comparator C21 and the negative side input terminal of the comparator C22 are B, and the positive side input terminal of the comparator C22 is C. A voltage of each terminal, A, B, and C is obtained by dividing a voltage between the terminal IN and the terminal GND with each resister ratio respectively, and such a voltage is set depending on a resister ratio of each terminal so that a relation of the terminals is [A>B>C] when the pulse signal input at the data carrier device 10 is static.

Here, when the pulse signal input at the data carrier device 10 switches from the low level to the high level, since the capacitor C1 is connected to the terminal A, a rise of the terminal A becomes later than a rise of the terminal B. This is because of a time constant set by the capacitor C1 and a parallel combined resister of the resister R3 and the resister R4 (hereinafter, abbreviated as R3//R4). Thus, a relation of the voltages of the terminal A and the terminal B becomes [A<B], and an output voltage V21 of the comparator C21 switches to the high level. After that, when a time passes, the time being much longer than the time constant set by the capacitor C1 and the resister R3//R4, the relation of the voltages of the terminal A and the terminal B becomes [A>B], and the output voltage V21 of the comparator C21 switches to the low level. Thus, as illustrated in the timing chart of FIG. 5, the output voltage V21 of the comparator C21 is obtained, the output voltage being synchronized in that the pulse signal input at the data carrier device 10 becomes from the low level to the high level.

Here, when the pulse signal input at the data carrier device 10 switches from the high level to the low level for the short fall time f1, since the capacitor C2 is connected to the terminal C, a fall of the terminal C becomes later than a fall of the terminal B. This is because of a time constant set by the capacitor C2 and a parallel combined resistance of the resister R5 and the resister R6 (hereinafter, abbreviated as R5//R6). Thus, a relation of the voltages of the terminal C and the terminal B becomes [B<C], and an output voltage V22 of the comparator C22 switches to the high level. After that, when a time passes, the time being much longer than the time constant set by the capacitor C2 and the resister R5//R6, the relation of the voltages of the terminal C and the terminal B becomes [B>C], and the output voltage V22 of the comparator C22 switches to the low level. On the other hand, when the pulse signal input to the data carrier device 10 switches from the high level to the low level for the long enough fall time f2 because of the time constant set by the capacitor C2 and the resister R5//R6, the relation of the voltages of the terminal C and the terminal B is maintained to be [B>C]. Thus, as illustrated in the timing chart of FIG. 5, the output voltage V22 of the comparator C22 is obtained, the output voltage switching based on a fall time when the pulse signal input at the data carrier device 10 switches from the high level to the low level.

When a pulse of the terminal IN includes the short fall time f1, a pulse of the output signal Vf is induced, and a rise edge of the data signal DATA is formed. On the other hand, when the pulse of the terminal IN includes the long fall time f2, the pulse of the output signal Vf is not induced, and the rise edge of the data signal DATA is not formed. The above output voltage V21 corresponds to the output voltage Vr of FIG. 2, and the above output voltage V22 corresponds to the output voltage Vf of FIG. 2.

The data signal conversion circuit 13 inputs each of comparator output signals V21 and V22 obtained as above, and generates the clock signal CLK and the data signal DATA necessary for communicating data. Here, in the timing chart illustrated in FIG. 5, the data signal conversion circuit 13 generates the same signal as the output voltage V21 of the comparator C21 as the clock signal CLK. For example, the data signal conversion circuit 13 includes an SR flip-flop circuit. The output voltage V22 of the comparator C22 is input at a terminal S of the SR flip-flop circuit, and the output voltage V21 of the comparator C21 is input at a terminal R of the SR flip-flop circuit. Thereby, the data signal DATA is generated. The data signal DATA is generated as a signal which switches from the low level to the high level as synchronized with a rise of the output voltage V22 of the comparator C22, and switches from the high level to the low level as synchronized with a rise of the output voltage V21 of the comparator C21.

Here, in the circuit example of FIG. 4, a relation of input voltages of the comparators is determined only by a voltage between the terminal IN and the terminal GND, a resister, and a capacitor, and it is enough to be able to maintain a relative relation of each terminal, and the severe accuracy is not necessary. Thus, when the data carrier device 10 is produced by a semiconductor process, the circuit is configured so that the production variation of the process is not large influence for the circuit.

Figure 6:
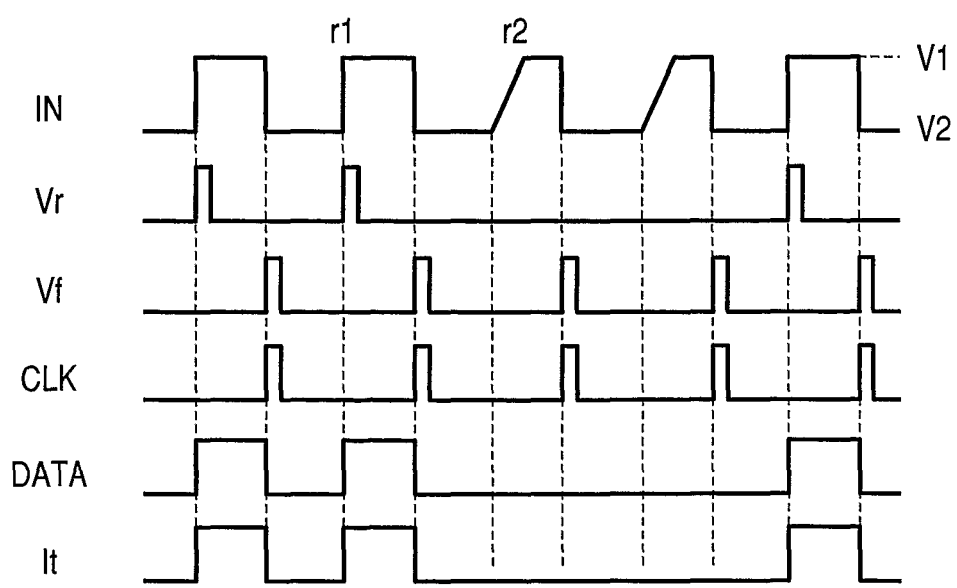
FIG. 6 is a timing chart illustrating an example of operations of the configuration illustrated in FIG. 1.

Here, in the timing chart of FIG. 2, while such a case is described that the receiving signal including pulses, whose fall times f1 and f2 are mutually different, is input at the terminal IN, a similar timing chart can be also applied to such a case that the receiving signal including pulses, whose rise times are mutually different, is input at the terminal IN. A timing chart of such a case is illustrated in FIG. 6. A pulse voltage is input from the transmission signal outputting circuit of the data carrier driving device 15 to the terminal IN of the data carrier device 10, the pulse voltage including a constant value as a fall time from the high level V1 of a voltage amplitude to the low level V2 of the voltage amplitude. The pulse voltage includes two different rise times of a rise time r1 from the low level V2 to the high level V1 and a rise time r2 which is enough longer than the time r1. The terminal GND is connected to the ground voltage as a reference voltage. In this case, V2, which is the low level of the pulse voltage, is enough higher than the ground (GND) voltage.

The fall detection circuit 12 of FIG. 1 detects that the pulse input at the terminal IN of the data carrier device 10 falls from the high level V1 to the low level V2. For example, the fall detection circuit 12 outputs the output signal Vf which switches from a low level to a high level as synchronized with a fall of the pulse input at the terminal IN from the high level V1 to the low level V2, and after that, switches to the low level again.

The rise detection circuit 11 of FIG. 1 detects that the pulse input at the terminal IN of the data carrier device 10 rises from the low level V2 to the high level V1. For example, the rise detection circuit 11 outputs the output signal Vr which switches from a low level to a high level as synchronized with a rise of the pulse input at the terminal IN from the low level V2 to the high level V1, and after that, switches to the low level again.

As illustrated in FIG. 6, by inputting the output signal Vf of the fall detection circuit 12 at the terminal IN1 of the data signal conversion circuit 13 of FIG. 3, the clock signal CLK is generated as the same signal as the output signal Vf of the fall detection circuit 12, and is output from the terminal OUT1. By inputting the output signal Vr of the rise detection circuit 11 to the terminal IN2, the data signal DATA switches from the low level to the high level as synchronized with a rise of the output signal Vr of the rise detection circuit 11. Thus, the data signal DATA is generated as a signal which switches from the high level to the low level as synchronized with a rise of the output signal Vf of the fall detection circuit 12, and is output from the terminal OUT2.

When a pulse of the terminal IN includes the short rise time r1, a pulse of the output signal Vr is induced, and a rise edge of the data signal DATA is formed. On the other hand, when the pulse of the terminal IN includes the long rise time r2, the pulse of the output signal Vr is not induced, and a rise edge of the data signal DATA is not formed.

As illustrated in FIG. 6, the data signal DATA is switched based on a rise and a fall of the pulse signal input at the data carrier device 10, and the clock signal CLK is obtained, the clock signal being synchronized with a frequency of the pulse signal input at the data carrier device 10. The internal circuit 14 inputs the generated clock signal CLK and data signal DATA to communicate data. Specifically, when transferring the data signal, the data carrier device 10 ON/OFF-controls the constant current It with the control signal Vt. The data carrier driving device 15 detects the data signal transmitted from the data carrier device 10 by detecting the existence of the constant current It with the current detection circuit in the data carrier driving device 15. Thereby, bidirectional communication is executed between the data carrier device 10 and the data carrier driving device 15.

Here, to suppress a system power consumption, it is desirable that a time in which the constant current It is flowing be as short as possible by finely ON/OFF controlling the constant current It as the data signal transferred by the data carrier device 10. The existence of the constant current It is detected by the current detection circuit in the data carrier driving device 15. Thus, if the timing in which the constant current It is flowing is synchronized with the transmission signal from the transmission signal outputting circuit of the data carrier driving device 15, it becomes easier for the current detection circuit in the data carrier driving device 15 to detect the existence of the constant current It. In addition, a useless power consumption can be suppressed, the useless power consumption being induced by the constant current It flowing other than during the detection.

For example, such a circuit configuration is assumed that the current detection circuit in the data carrier driving device 15 includes a resister, and the existence of the constant current It is detected by a voltage difference between both sides of the resister, the voltage difference being induced by a value of the current flowing in the resister.

In this case, when the constant current It flows, it may be considered that a voltage value from the data carrier driving device 15 to the terminal IN of the data carrier device 10 is lowered from a voltage value while the constant current It is not flowing by a voltage induced in a resister as the current detection circuit. The data carrier device 10 generates a source voltage for all circuits included in the data carrier device 10 from the signals input between the terminal IN and the terminal GND of the data carrier device 10 from the data carrier driving device 15.

If the constant current It flows while a level of the pulse input at the terminal IN, illustrated in FIG. 6, of the data carrier device 10 is the low level V2, such a fact that the voltage value to the terminal IN of the data carrier device 10 is lowered due to this operation results in the lowering of the source voltage for the data carrier device 10.

This may not be desirable for the stable operation of the data carrier device 10. Thus, in a total system, it may be effective that the constant current It is caused to flow as the data signal transferred by the data carrier device 10 only while a level of the pulse input at the terminal IN of the data carrier device 10 is the high level V1.

In this case, like the timing chart illustrated in FIG. 6, it becomes effective to control the constant current It to flow only while a level of the data signal DATA is the high level by controlling the control signal Vt for ON/OFF-controlling the constant current It as the data signal transferred by the data carrier device 10.

The data signal DATA switches from the low level to the high level based on the rise and fall times of the voltage input at the terminal IN of the data carrier device 10 from the data carrier driving device 15, and switches from the high level to the low level as synchronized with the fall.

At this time, the constant current It flows as the data signal transferred by the data carrier device 10 as synchronized with the voltage input at the terminal IN of the data carrier device 10 from the data carrier driving device 15, so that the constant current It can be easily detected by the current detection circuit in the data carrier driving device 15. The constant current It is controlled to flow only while a level of the pulse input at the terminal IN of the data carrier device 10 is the high level V1, so that a time in which the constant current It flows can be shorten, and a useless power consumption can be suppressed. In addition, such a situation can be suppressed that the voltage value to the terminal IN of the data carrier device 10 is lowered since the constant current It flows, in which the voltage value may be lowered depending on a circuit configuration of the current detection circuit in the data carrier driving device 15, and the data carrier device 10 can stably operate.

Meanwhile, in the present exemplary embodiment, two examples have been described. The first example is a case that the receiving signal including pulses whose fall times f1 and f2 are mutually different is input at the terminal IN as illustrated in the timing chart of FIG. 2. The second example is a case that the receiving signal including pulses, whose rise times r1 and r2 are mutually different, is input at the terminal IN as illustrated in the timing chart of FIG. 6. However, a rise and a fall of the pulse voltage may be in any manner related to the clock signal CLK and the data signal DATA for communicating data.

Figure 7:
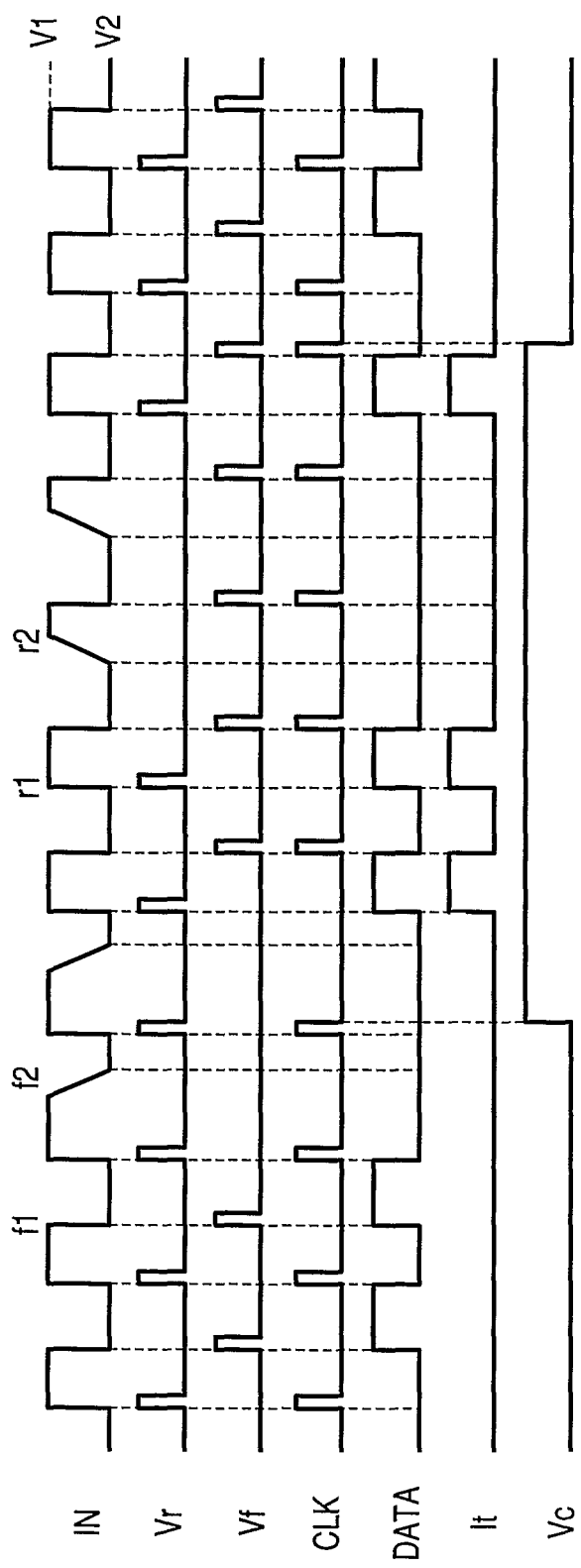
FIG. 7 is a timing chart illustrating an example of operations when replacing the relations of a rise and a fall of a pulse voltage, and a clock signal CLK and a data signal DATA of the data communication according to the exemplary embodiment of the present invention.

Here, FIG. 7 illustrates an example of a timing chart for communicating by replacing the relations of a rise and a fall of the pulse voltage input at the terminal IN of the data carrier device 10 and the clock signal CLK and the data signal DATA for transmitting data. While the constant current It is not supplied for communicating data from the data carrier device 10 to the data carrier driving device 15, the pulse including each of the different fall times f1 and f2 is input at the terminal IN as a receiving signal. While the constant current It is supplied for transmitting data from the data carrier device 10 to the data carrier driving device 15, the pulse including each of the different rise times r1 and r2 is input at the terminal IN as the receiving signal.

In the example of FIG. 7, a control signal Vc is provided, the control signal Vc replacing the relations of a rise and a fall of the pulse voltage input at the terminal IN of the data carrier device 10 and the clock signal CLK and the data signal DATA for communicating data. A timing in which the control signal Vc switches is as follows; a low level and a high level of this control signal Vc switches, for example, when the number of pulses of the clock signal CLK reaches a preset count value by using a pulse count number of the clock signal CLK. By the way, while the control signal Vc is switching, a fall time of the input signal input at the terminal IN becomes f2. This is because a level of the data signal DATA becomes the high level if a fall time is caused to be the abrupt f1. As a result, this becomes different from such an original intention that the constant current It is supplied only while a level of the pulse signal input to the terminal IN is the high level V1.

In the present example, the control signal Vc switches the relations of the signals input to the terminal IN1 and the terminal IN2 of the data signal conversion circuit 13 of FIG. 3 and the output signal Vr of the rise detection circuit 11 and the output signal Vf of the fall detection circuit 12. Thereby, the relations of the rise and the fall of the pulse voltage input at the terminal IN of the data carrier device 10 and the clock signal CLK and the data signal DATA for communicating data are replaced.

In the present exemplary embodiment, such an example has been described that the clock signal CLK for communicating data is always output as synchronized with the pulse voltage input from the data carrier driving device 15 to the terminal IN of the data carrier device 10. However, data may be communicated as including such a term that the clock signal CLK is not output. The term can be set by causing a rise time and a fall time of the pulse voltage input from the data carrier driving device 15 to the terminal IN of the data carrier device 10 to be long enough, or causing a level of the pulse voltage to be always the low level V2. Thereby, signal levels of the clock signal CLK and the data signal DATA in the data carrier device 10 can be fixed, the internal circuit 14 in the data carrier device 10 can be caused to be stationary, and the power consumption of the data carrier device 10 can be suppressed.

In the present exemplary embodiment, a time for communicating data may be shorten by causing the number of types of a rise time or a fall time for the data signal of the pulse voltage input from the data carrier driving device 15 to the terminal IN of the data carrier device 10 to be three or more values.

In the present exemplary embodiment, a frequency and a duty ratio of the pulse voltage input from the data carrier driving device 15 to the terminal IN of the data carrier device 10 may be constant or may not be constant.

In the present exemplary embodiment, two or more types of rise times or fall times may be provided or another data signal may be added for the data signal of the pulse voltage input from the data carrier driving device 15 to the terminal IN of the data carrier device 10. For example, a time for communicating data may be shorten by adding a data signal other than the data signal in the rise time or the fall time by providing two or more values of frequencies of the pulse signal, or by providing two or more values of duty ratios of the pulse signal.

In the description of the present exemplary embodiment, while the terminal IN as a signal terminal and the terminal GND as a reference voltage terminal are provided to the configuration, it is not necessary that a voltage of the reference voltage terminal is necessarily the GND voltage. For example, the configuration may be such a configuration that a constant voltage is input as a reference voltage from the data carrier driving device 15 to one terminal of the data carrier device 10, and a signal is input from the data carrier driving device 15 to one remaining terminal of the data carrier device 10.

The reference voltage of the data carrier device 10 may not be necessarily input from the data carrier driving device 15. A reference voltage is input from some one other than the data carrier driving device 15 to one terminal of the data carrier device 10, and a signal is input from the data carrier driving device 15 to one remaining terminal of the data carrier device 10.

For example, the configuration may be such a configuration that a voltage of the reference voltage terminal of the data carrier device 10 may not be a constant voltage, and both of the signals input from the data carrier driving device 15 to two terminals of the data carrier device 10 include a frequency and a duty ratio. If data can be communicated between the data carrier driving device 15 and the data carrier device 10 based on the signals induced between the two terminals of the data carrier device 10, the signals of the data carrier driving device 15 and the data carrier device 10 may be configured in any manner.

As described above, according to the present exemplary embodiment, a two lines contacting data communication system is provided, the system including the first data communication apparatus and the second data communication apparatus (the data carrier driving device 15 and the data carrier device 10) through the first and second contact points. The data carrier driving device 15 and the data carrier device 10 are connected only by two terminals of the first contact point, the terminal IN, and the second contact point, the terminal GND. A voltage is applied from the data carrier driving device 15 to the data carrier device 10 through the terminal IN, and the terminal GND, the second contact point, is connected.

The data carrier device 10 inputs at the terminal IN the receiving signal including the pulses whose rise times or fall times are mutually different, in a receiving signal inputting step, and inputs the reference voltage at the terminal GND in a reference voltage inputting step. The data carrier device 10 generates a source voltage for all circuits (the rise detection circuit 11, the fall detection circuit 12, the data signal conversion circuit 13, and the internal circuit 14) based on the receiving signal input at the terminal IN and the reference voltage input at the terminal GND. The rise detection circuit 11 detects a rise or a rise time of the receiving signal input at the terminal IN in a rise detection step. The fall detection circuit 12 detects a fall or a fall time of the receiving signal input at the terminal IN in a fall detection step. The data signal conversion circuit (signal generation circuit) 13 generates the clock signal CLK or the data signal DATA based on a result of a detection by the rise detection circuit 11 or the fall detection circuit 12 in a signal generating step. Specifically, the data signal conversion circuit 13 generates the data signal DATA based on the rise time or the fall time detected by the rise detection circuit 11 or the fall detection circuit 12. The internal circuit (transmission signal outputting circuit) 14 inputs the clock signal CLK or the data signal DATA generated by the data signal conversion circuit 13 in a transmission signal outputting step, and outputs a transmission signal to the terminal IN based on the clock signal CLK or the data signal DATA.

The transmission signal outputting circuit in the data carrier driving device 15 outputs the transmission signal including the pulses, whose rise times or fall times are mutually different, to the terminal IN of the data carrier device 10 based on a transmission data in the transmission signal outputting step. The current detection circuit (data generation circuit) in the data carrier driving device 15 generates a receiving data from the data carrier device 10 by detecting the existence of a constant current flowing to the terminal IN in a data generation step. Thereby, the bidirectional communication is executed between the data carrier device 10 and the data carrier driving device 15.

According to the present exemplary embodiment, a size of a system can be reduced by enabling bidirectional data communication between two contact points. The data carrier device 10 and the data carrier driving device 15 thereof can be realized at a low cost.

Any above exemplary embodiments illustrate only embodying examples for implementing the present invention, and the technical scope of the present invention may not be limitedly understood due to such examples. That is, the present invention may be implemented in a variety of forms without departing from the technical concept or the main features of the present invention.

This application claims the benefit of Japanese Patent Applications Nos. 2007-047551, filed Feb. 27, 2007, and No. 2007-279354, filed Oct. 26, 2007, which are hereby incorporated by reference in their entirety.

The invention claimed is:

1. A data communication apparatus comprising:
a signal terminal that inputs a receiving signal including a plurality of pulses of which rise times, each for rising from a low level of a voltage amplitude to a high level of the voltage amplitude, or fall times, each for falling from the high level of the voltage amplitude to the low level of the voltage amplitude, are different mutually;
a reference voltage terminal that inputs a reference voltage;
a rise detection circuit that detects the rise time for rising from the low level of the voltage amplitude to a high level of the voltage amplitude of each of the plurality of pulses of the receiving signal;
a fall detection circuit that detects the fall time for falling from the high level of the voltage amplitude to the low level of the voltage amplitude of each of the plurality of pulses of the receiving signal;
a data signal conversion circuit that generates a clock signal synchronized with the rising or falling of the receiving signal, and that generates a data signal based on a result of at least one of the detections of the rise time and the fall time by the rise detection circuit and the fall detection circuit; and
an internal circuit that inputs the clock signal and the data signal generated by the data signal conversion circuit, and that outputs a transmission signal to the signal terminal.

2. The data communication apparatus according to claim 1, wherein the rise detection circuit, the fall detection circuit and the data signal conversion circuit are supplied with a source voltage generated based on the receiving signal and the reference voltage.

3. The data communication apparatus according to claim 1, wherein the internal circuit has a switch circuit connected to the signal terminal that controls whether a constant current flows for outputting the transmission signal to the signal terminal.

4. The data communication apparatus according to claim 1, wherein the reference voltage is a ground voltage.

5. A data communication system comprising a first data communication apparatus and a second data communication apparatus, wherein
the first data communication apparatus includes:
a transmission signal outputting circuit that outputs, through a signal terminal to the second data communication apparatus, a transmission signal including a plurality of pulses of which rise times, each for rising from a low level of a voltage amplitude to a high level of the voltage amplitude, or fall times, each for falling from the high level of the voltage amplitude to the low level of the voltage amplitude, are different mutually based on transmission data; and
a current detection circuit that generates receiving data based on a current flowing to the signal terminal, and
the second data communication apparatus includes:
a signal terminal that inputs a receiving signal including a plurality of pulses of which rise times, each for rising from a low level of a voltage amplitude to a high level of the voltage amplitude, or fall times, each for falling from the high level of the voltage amplitude to the low level of the voltage amplitude, are different mutually;
a reference voltage terminal that outputs a reference voltage;
a rise detection circuit that detects the rise time for rising from the low level of a voltage amplitude to the high level of the voltage amplitude of each of the plurality of pulses of the receiving signal received through the signal terminal from the first data communication apparatus;
a fall detection circuit that detects the fall time for falling from the high level of the voltage amplitude to the low level of the voltage amplitude of each of the plurality of pulses of the receiving signal;
a data signal conversion circuit that generates a clock signal synchronized with the rising or falling of the receiving signal, and that generates a data signal based on a result of at least one of the detections of the rise time and the fall time by the rise detection circuit and the fall detection circuit; and
an internal circuit that inputs the clock signal and the data signal generated by the data signal conversion circuit, and that outputs a transmission signal to the signal terminal.

6. A data communication method comprising:
a receiving signal inputting step of inputting, at a signal terminal, a receiving signal including a plurality of pulses of which rise times, each for rising from a low level of a voltage amplitude to a high level of the voltage amplitude, or fall times, each for falling from the high level of the voltage amplitude to the low level of the voltage amplitude, are different mutually;
a reference voltage terminal inputting step of inputting at a reference voltage terminal a reference voltage;
a rise detection step of detecting the rise time for rising from the low level of the voltage amplitude to a high level of the voltage amplitude of each of the plurality of pulses of the receiving signal;
a fall detection step of detecting the fall time for falling from the high level of the voltage amplitude to the low level of the voltage amplitude of each of the plurality of pulses of the receiving signal;
a signal generation step of generating a clock signal synchronized with the rising or falling of the receiving signal, and that generates a data signal based on a result of result of at least one of the detections of the rise time and the fall time at the rise detection step and the fall detection step; and
a transmission signal outputting step of outputting a transmission signal to the signal terminal based on the clock signal and the data signal,
wherein, during the signal generation step, the data signal is generated based on at least one rise time or fall time detected in the rise detection step or the fall detection step.

* * * * *